United States Patent
Brauner (10) Patent No.: US 8,644,783 B2
(45) Date of Patent: Feb. 4, 2014

(54) METHODS AND SYSTEMS FOR DETERMINING AN OFFSET TERM FOR A SYNTHESIZER SIGNAL, AND METHODS AND SYSTEMS FOR PRODUCING A PHASE-CORRECTED DIGITAL SIGNAL

(75) Inventor: Thomas Brauner, Thalwil (CH)

(73) Assignee: u-blox AG, Thalwil (CH)

( * ) Notice: Subject to any disclaimer, the term of this patent is extended or adjusted under 35 U.S.C. 154(b) by 130 days.

(21) Appl. No.: 13/424,245

(22) Filed: Mar. 19, 2012

(65) Prior Publication Data

US 2013/0176059 A1     Jul. 11, 2013

(30) Foreign Application Priority Data

Jan. 6, 2012   (EP) ..................................... 12405002

(51) Int. Cl.
*H04B 7/00*    (2006.01)
*H03D 3/24*    (2006.01)

(52) U.S. Cl.
USPC ............................ 455/260; 327/156; 375/376

(58) Field of Classification Search
USPC ................ 455/260, 258, 259, 180.3, 130, 76; 327/147, 156, 105; 375/376, 373, 375
See application file for complete search history.

(56) References Cited

U.S. PATENT DOCUMENTS

| | | | | |
|---|---|---|---|---|
| 6,107,843 A | * | 8/2000 | de Gouy et al. | 327/105 |
| 6,317,476 B1 | * | 11/2001 | Oishi et al. | 375/371 |
| 6,456,164 B1 | * | 9/2002 | Fan | 331/16 |
| 6,553,089 B2 | * | 4/2003 | Huh et al. | 375/376 |
| 6,556,082 B1 | * | 4/2003 | Wang et al. | 330/288 |
| 6,914,935 B2 | * | 7/2005 | Eklof | 375/238 |
| 7,463,710 B2 | * | 12/2008 | Walsh et al. | 375/376 |

* cited by examiner

*Primary Examiner* — Sonny Trinh
(74) *Attorney, Agent, or Firm* — Edward B. Weller (57) ABSTRACT

A fractional-N PLL synthesizer has an up-down counter counting up for positive edges of a frequency-divided signal produced by a frequency divider with a fractional divide ratio in a feedback path of the synthesizer and down for positive edges of a reference signal. A phase offset between portions of the synthesizer signal before and after a loss-of-lock interval is then assessed as a numerical value proportional to the product of the divide ratio and the cycle difference registered by the up-down counter (36) after the loss-of-lock interval. A correction term derived from the phase offset can be used in a signal processing device as employed, e.g., in a GNSS receiver, for producing, from an analog input signal, a phase-corrected baseband signal where portions of the signal before and after loss of lock are phase coherent.

16 Claims, 4 Drawing Sheets

METHODS AND SYSTEMS FOR
DETERMINING AN OFFSET TERM FOR A
SYNTHESIZER SIGNAL, AND METHODS
AND SYSTEMS FOR PRODUCING A
PHASE-CORRECTED DIGITAL SIGNAL

RELATED APPLICATIONS

This application claims the benefit of priority under 35 USC §119 to European Patent Application No. EP12405002.2 filed on Jan. 6, 2012, the entire contents of which are incorporated herein by reference.

FIELD OF THE INVENTION

The invention concerns a method of determining an offset term for a synthesizer signal and a method of producing a phase-corrected digital signal. Methods of this kind are used, e.g., in receivers, in particular, those for DSSS signals like mobile telephone and GNSS receivers. The invention also concerns a fractional-N PLL synthesizer and a signal processing device as well as a GNSS receiver comprising a signal processing device according to the invention.

PRIOR ART

PLL (phase-locked loop) synthesizers where a frequency divider in the feedback path of the PLL derives, from a reference signal, a synthesizer signal of higher frequency are used in various contexts. The use of fractional-N frequency dividers allows for fractional divide ratios relating the frequency of the synthesizer signal to the frequency of the reference signal and thereby for a relatively narrow spacing of possible frequency channels. Feedback paths of this type are usually implemented using frequency dividers with counters which regularly switch between two or more different integer divide ratios. For example, in so-called dual-modulus fractional-N synthesizers, the frequency divider can be configured to divide the frequency of the synthesizer signal K times by an integer N+1 and L−K times by N where L>K. The average divide ratio Nf is then N+K/L or (NL+K)/L, i.e., a fractional, non-integer divide ratio. As the frequency of the synthesizer signal is Nf times the frequency of the reference signal, the output signal frequency can be varied over a wide range with a fine resolution, depending on the choice of the parameters N, L and K. The frequency divider can, in particular, be controlled by a sigma-delta modulator, but there are also other possibilities for implementing a fractional-N divider.

A problem with PLL synthesizers employing a fractional-N frequency divider which is absent in the case of integer-N frequency dividers is the fact that whenever two state-of-lock intervals where the PLL is closed and lock is established are separated by a loss-of-lock interval where lock was lost, the portions of the synthesizer signal in the two state-of-lock intervals are, as a rule, not phase coherent, that is, there is a phase shift of the portion of the synthesizer signal in the second interval in relation to a virtual continuation of the undisturbed synthesizer signal of the first interval, i.e., a continuation of said signal as if no loss of lock had occurred. This circumstance can in certain applications severely compromise the processing of a received signal, in particular, the reliable extraction of data from the same. Various solutions to this problem have been proposed.

In US 2009/0 224 974 A1, a method is disclosed where the phase relation between the synthesizer signal and a reference signal derived from a clock signal is determined before and after a down-time when the circuit is in a power saving mode and the function of the PLL, apart from the clock, is suspended. A phase offset between the synthesizer signal before and after the down-time is determined as the difference between the phase relations of the same and the reference signal before and after the down-time. The method is complicated and relies on a reference signal whose frequency is higher than that of the synthesizer signal which will normally require a reduction of the frequency of the latter. The phase relations between the synthesizer signal and the reference signal can be determined only with a limited degree of precision, in fact, only upper and lower bounds of the same are assessed.

In U.S. Pat. No. 6,107,843 A a method is disclosed where the divide ratio can be varied by switching between different values of some or all of the parameters which have been designated above as N, L and K. In order to uphold phase coherence, switching between different sets of parameters is only enabled where the number of cycles of the reference signal is a multiple of L or, where different values of L are used, a smallest common multiple of those values. The method usually requires a waiting period before an intended changeover to a different set of parameters can be made. It is not possible to determine a phase offset caused by an unforeseen sudden loss of lock.

Similar methods are disclosed in U.S. Pat. No. 6,556,082 B2 and U.S. Pat. No. 7,463,710 B2. In the latter document an adjustment of the phase of the PLL synthesizer signal by a transient modification of the parameter corresponding to L above is also described.

SUMMARY OF THE INVENTION

It is an aspect of the present invention to provide a method of determining an offset term which can be used for correcting phase offsets caused by a transitory lock of loss and which works reliably for a PLL fractional-N synthesizer.

With the method according to the invention the phase relationship between the synthesizer signal before and after loss of lock can be assessed and compensated essentially exactly even where loss of lock was caused by some sudden, unforeseen event, e.g., independently of whether it was lost due to intermediate switching to a different feedback path, switching of tuning capacitors, supply spikes or powering down of parts of the circuit connected to the PLL or some other cause.

The method according to the invention is simple and easy to implement. Switching between different divide ratios is not temporally restricted. The method does not depend on how the frequency divider is implemented, in particular, the latter need not be of the type described above in connection with the prior art.

It is another aspect of the invention to provide a method of producing a phase-corrected digital signal which is phase-coherent across periods of transitory loss of lock.

It is another aspect of the invention to provide a synthesizer which provides a cycle count signal from which an offset term can be derived.

It is still another aspect of the invention to provide a signal processing device which produces a phase-corrected digital signal which is phase-coherent across periods of transitory loss of lock.

It is a further aspect of the invention to provide a GNSS receiver comprising a signal processing device according to the invention.

BRIEF DESCRIPTION OF THE DRAWINGS

In the following the invention is described in more detail with reference to drawings showing and illustrating embodiments.

DESCRIPTION OF THE PREFERRED EMBODIMENTS

In the following a GNSS (global navigation satellite system) receiver suitable for GPS is described which comprises a signal processing device according to the invention. Apart from GNSS receivers, the signal processing device according to the invention can be used in other contexts like, in particular, DSSS (direct signal spread spectrum) receivers like mobile telephone receivers. The modifications which are necessary if other GNSS systems like GLONASS or GALILEO are to be used or if the invention is to be employed in a different context like mobile telephony are straightforward.

The receiver comprises (FIG. 1) an antenna 1 followed by a radio frequency part 2, a band-pass filter 3, a TCXO (temperature compensated crystal oscillator) 4 functioning as a clock for the receiver and (FIG. 2) a baseband part 5. The radio frequency part 2 and the baseband part 5 are preferably implemented on a single semiconductor chip but other solutions are also possible.

Figure 1:
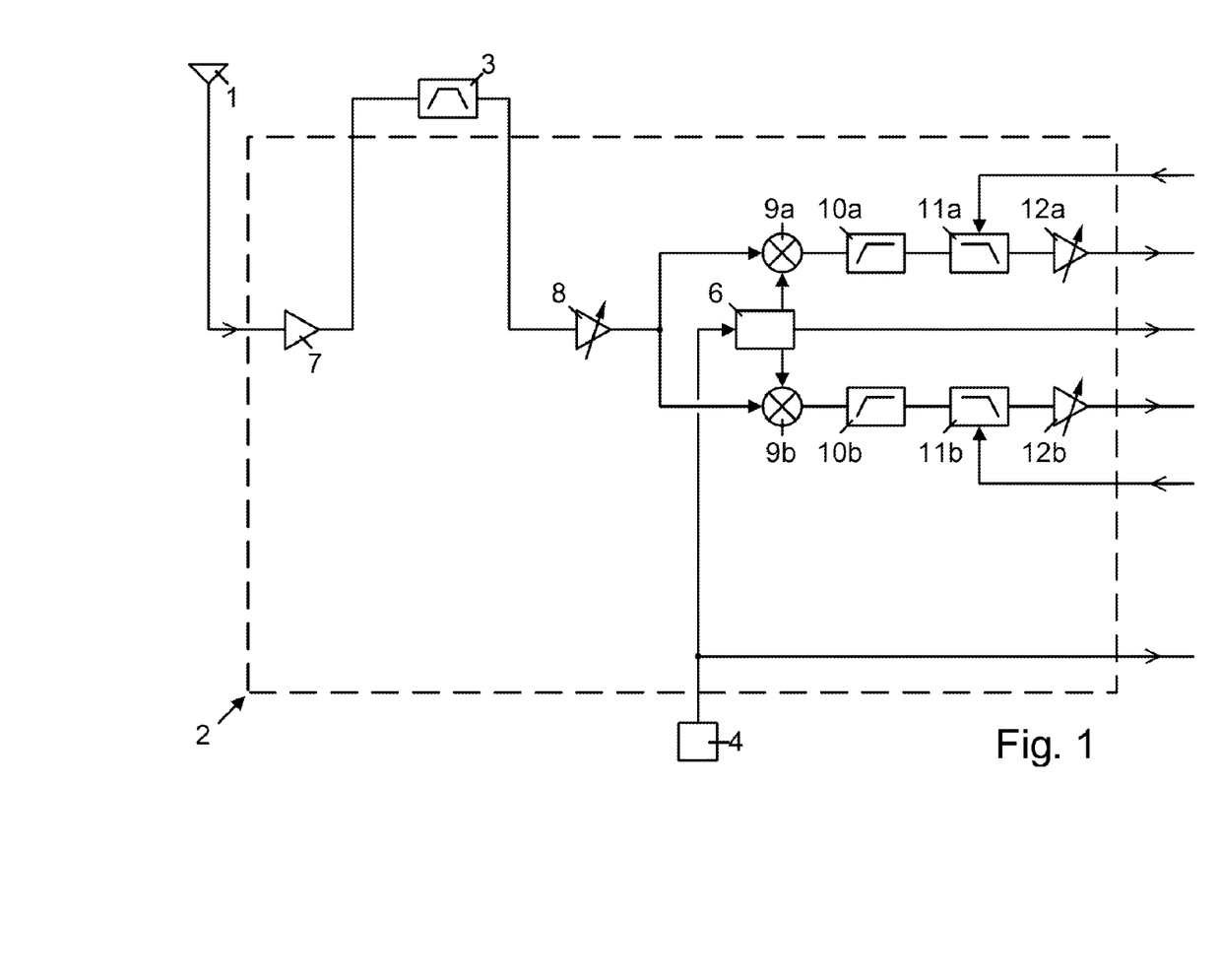
FIG. 1 shows a radio frequency part of a GNSS receiver with part of a signal processing device according to the invention.

The band-pass filter 3, usually an SAW (surface acoustic wave) filter, is a separate component. The TCXO 4, also a separate component, provides a basic frequency of between 19 MHz and 40 MHz, e.g., 26 MHz, which is fed to the radio frequency part 2 and further to the baseband part 5. In the radio frequency part 2 the output signal of TCXO 4 controls a front-end synthesizer 6 which produces a 3' 144 MHz clock signal from which two local oscillator signals with half the frequency, i.e., 1' 572 MHz, are derived with one of the local oscillator signals phase-shifted by 90° with respect to the other.

The antenna input of the radio frequency part 2 is followed by a low noise amplifier 7 which is connected, via the external band-pass filter 3 and a controllable RF amplifier 8, to analog mixers 9a,b which also receive the local oscillator signals from front-end synthesizer 6. Together they provide an I and Q component of a complex analog signal shifted down to an intermediate frequency of approximately 3 MHz. They are each followed by a high-pass filter 10a;b with a cut-off frequency of about 20 kHz and a controllable low-pass filter 11a;b with a cut-off frequency of around 7.5 MHz connected to baseband part 5 via programmable gain amplifiers 12a;b.

Figure 2:
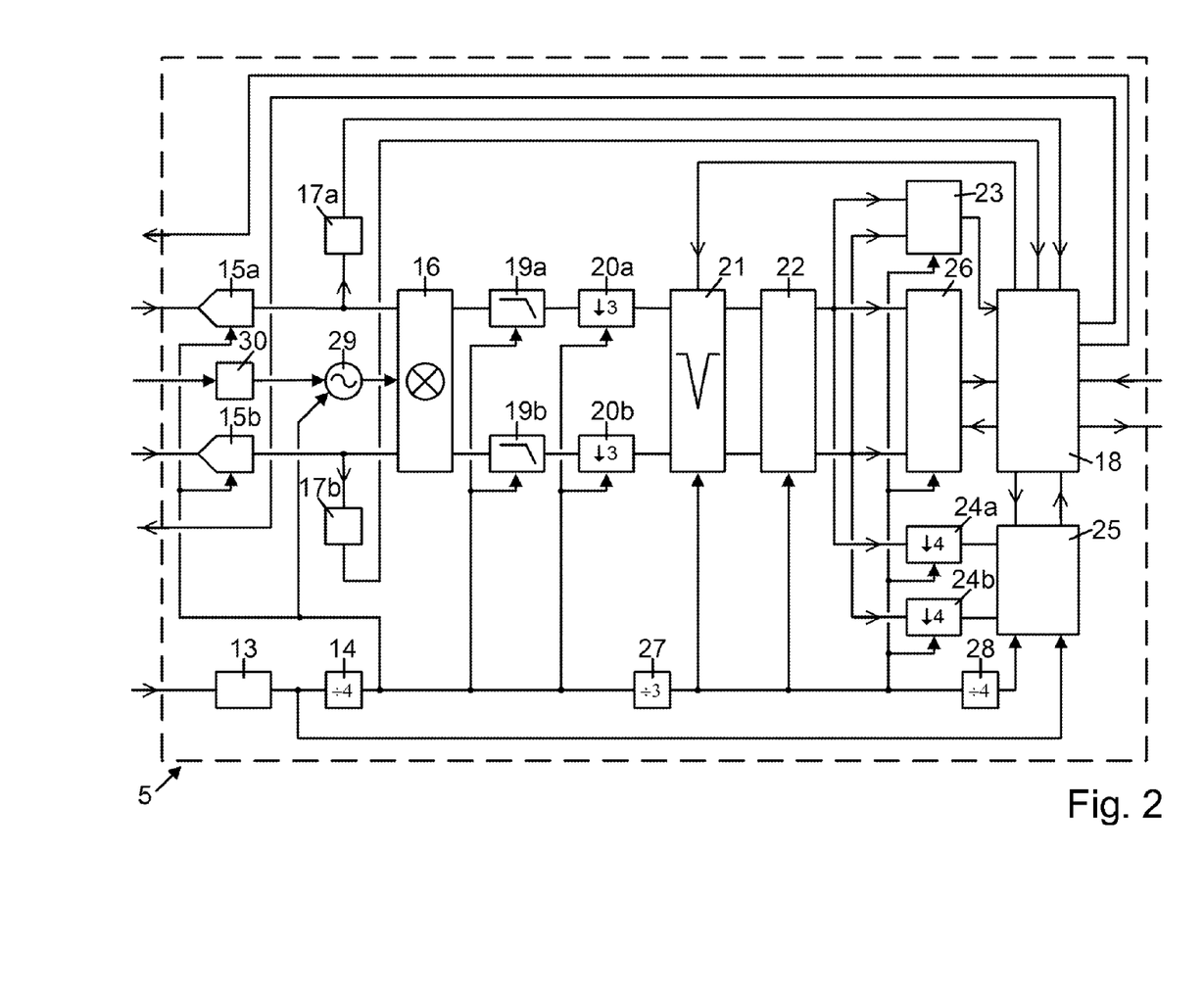
FIG. 2 shows a baseband part of the GNSS receiver whose radio frequency part is shown in FIG. 1, with another part of the signal processing device according to the invention.

The output signal of TCXO 4 is also fed to the baseband part 5 where it is connected to a baseband synthesizer 13, a PLL synthesizer producing a clock signal with a frequency of 96 MHz which is reduced to 24 MHz by a subsequent frequency divider 14. In the baseband part 5 A/D (analog-to-digital) converters 15a,b, each with 5 bit resolution, are provided for sampling the signal from variable gain amplifiers 12a; b 20 with a sampling rate of 24 MHz, producing a complex digital IF (intermediate frequency) signal which is fed to a complex digital mixer 16 that reduces it to baseband and to frequency analyzers 17a,b whose outputs are connected to a control unit 18 which controls low-pass filters 11a,b in radio frequency part 2. The complex mixer 16 is followed by decimation filters 19a,b, each with a cut-off frequency of 3 MHz, and down-samplers 20a;b. A/D converters 15a,b, complex mixer 16, frequency analyzers 17a,b, decimation filters 19a,b and down-samplers 20a,b are controlled by the clock signal from frequency divider 14.

A band-stop unit 21 for filtering a raw digital signal by removing continuous wave interferers and a decimator 22 for reducing the filtered digital signal from 6 to 3 bits are followed by a frequency analyzer 23 whose output signal is used by control unit 18 to control the band-stop unit 21 and, via down-samplers 24a,b, by an acquisition unit 25 for identifying components of the signal as emitted by specific satellites of the GNSS system as well as by a tracking unit 26 for continually tracking said signal components and analyzing their time delays and for extracting data bits from them.

A frequency divider 27 produces, from the 24 MHz signal output of frequency divider 14, an 8 MHz clock signal which controls band-stop unit 21, decimator 22, frequency analyzer 23, down-samplers 24a,b and tracking unit 26. A further frequency divider 28 provides a 2 MHz clock signal for the acquisition unit 25 which also receives the 96 MHz clock signal from baseband synthesizer 13. Control unit 18 receives data from tracking unit 26 which, apart from the time delays of signals emitted by the individual satellites, comprise almanac and ephemeris data extracted from said signals. From this data control unit 18 calculates the position of the GNSS receiver. The calculations which may also involve additional data stored in the receiver or transmitted to it via some additional link are carried out in ways well known in the art. The control unit 18 also controls acquisition unit 25 and tracking unit 26.

The complex mixer 16 is controlled by an NCO (numerically controlled oscillator) 29 which receives the output signal of frequency divider 14 and a phase correction signal from an offset calculation unit 30 which is controlled by a cycle count signal it receives from a cycle count output of front-end synthesizer 6 as will be explained in more detail below.

After the analog signal received by antenna 1 (FIG. 1) has been amplified by low noise amplifier 7 its spectrum is reduced to a 30 MHz band centered at the GPS frequency of 1'575.42 MHz by band-pass filter 3. After further amplification and mixing any DC component is removed by high-pass filters 10a,b and high frequencies are suppressed by low-pass filters 11a,b for anti-aliasing. The low-pass filters 11a,b are controlled by the control unit 18 (FIG. 2) based on the outputs of frequency analyzers 17a;b in such a 10 way that the signal is, with respect to the signal at a reference frequency of 3 MHz, attenuated by not more than −3 dB at 7.5 MHz and by at least −12 dB at 12 MHz, i.e., at half the sampling rate of A/D converters 15a,b at the input of baseband part 5. The programmable gain amplifiers 12a,b adjust the signal to the dynamic input range of A/D converters 15a,b.

The amplified and filtered complex analog signal is then converted to a complex digital signal by A/D converters 15a,b of baseband part 5 and then derotated, i.e., shifted essentially to zero, by complex digital mixer 16. After its spectrum has been reduced to a 3 MHz frequency band by decimation filters 19a,b its sampling rate is reduced to 8 MHz by down-samplers 20a;b. This raw digital signal which is restricted to a fixed raw signal frequency band extending from −3 MHz to +3 MHz is then fed to band-stop unit 21 for filtering. Several continuous wave interferers can be suppressed with negligible distortion of the raw digital signal to produce a filtered digital signal restricted to a filtered signal frequency band which coincides with the raw signal frequency band. In a next step the filtered digital signal is requantised from 6 bits to 3 bits in decimator 22 which uses a non-linear decimation table. The resulting digital signal is then fed in parallel to frequency analyzer 23, tracking unit 26 and, via down-samplers 24a,b which reduce the sampling frequency to 2 MHz, to acquisition unit 25.

In the acquisition unit 25 a signal derived from this input signal is correlated with internally produced characteristic sequences of GNSS satellites at various Doppler frequencies and with various code phase shifts. The relatively low 2 MHz sampling frequency allows efficient processing of the signal and, as a consequence, fast detection of the received satellite signals.

On the other hand, in tracking unit 26, where the sequences, Doppler frequencies and code phase shifts are applied that have yielded high correlation values in the acquisition unit 25, the higher sample frequency of 8 MHz allows for a very precise determination of the positions of the correlation peaks and associated phases of said satellite signals which in turn allows a precise calculation of receiver position. The results from frequency analyzer 23 which may be part of tracking circuit 26 using channels with varying scanning frequencies and constant sequences, are employed for the detection of any continuous wave interferers and determination of their interferer frequencies which are then used by control unit 18 for controlling band-stop unit 21 in such a way that the interferer frequencies are suppressed. The interferer frequencies can be identified by cyclical sweeping through the raw signal frequency band in steps of, e.g., 1 kHz and comparing the individual energy densities with a mean over the entire frequency band.

Figure 3:
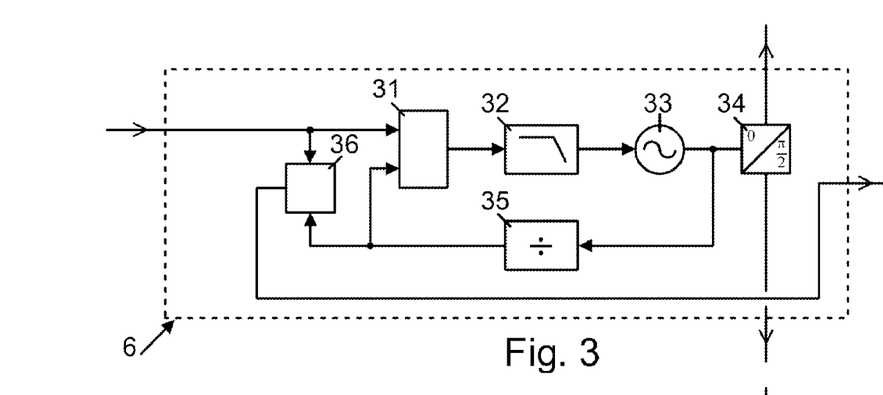
FIG. 3 shows a first embodiment of a fractional-N PLL synthesizer according to the invention.

Front-end synthesizer 6 is a fractional-N PLL synthesizer according to the invention which is shown in detail in FIG. 3.

A phase detector 31, implemented as a phase-frequency detector including a charge pump, has a first input for receiving a periodic reference signal with a fixed reference frequency $f_r$ from TCXO 4 and a second input. Its output is connected, via a loop filter 32, a low-pass filter, to a VCO (voltage-controlled oscillator) 33. A synthesizer signal produced by the latter, a periodic signal with a synthesizer frequency $f_s$, is transformed by a phase shifter 34 into two periodic local oscillator signals whose frequency $f_{LO}$ is half the frequency $f_s$ of the synthesizer signal, one of them shifted by π/2 or 90° with respect to the other. The two signals can also be considered as a single complex local oscillator signal. As explained above, each of said signals is fed to one of the analog mixers 9a;b. The output of the VCO 33 is also connected, via a feedback path with a frequency divider 35, to the second input of phase detector 31.

The frequency divider 35 is a fractional-N frequency divider which divides the frequency $f_s$ of the synthesizer signal by a fractional divide ratio Nf which is greater than 1 to provide a frequency-divided signal. The frequency divider 35 can, in a manner well known in the art, be configured to periodically divide the frequency of the synthesizer signal K times by N+1 and L−K times by N with N, L, K integers and N≥1 and L>K. The average divide ratio Nf is then N+K/L or (NL+K)/L, i.e., a fractional, non-integer divide ratio. In particular, frequency divider 35 can be controlled by a sigma-delta modulator. However, it is not important how the fractional-N frequency divider 35 is implemented. In any case, the frequency $f_{fd}$ of the frequency-divided signal (d) is related to the synthesizer frequency $f_s$ by $$f_{fd}=f_s/Nf. \quad (1)$$

A cycle detector implemented as an up-down counter 36 is connected to the input of front-end synthesizer 6 in parallel with the first input of phase detector 31 and to the output of frequency divider 35. At a cycle count output of front-end synthesizer 6 up-down counter 36 produces a cycle count signal which, as mentioned above, is provided to offset calculation unit 30.

Figure 5:
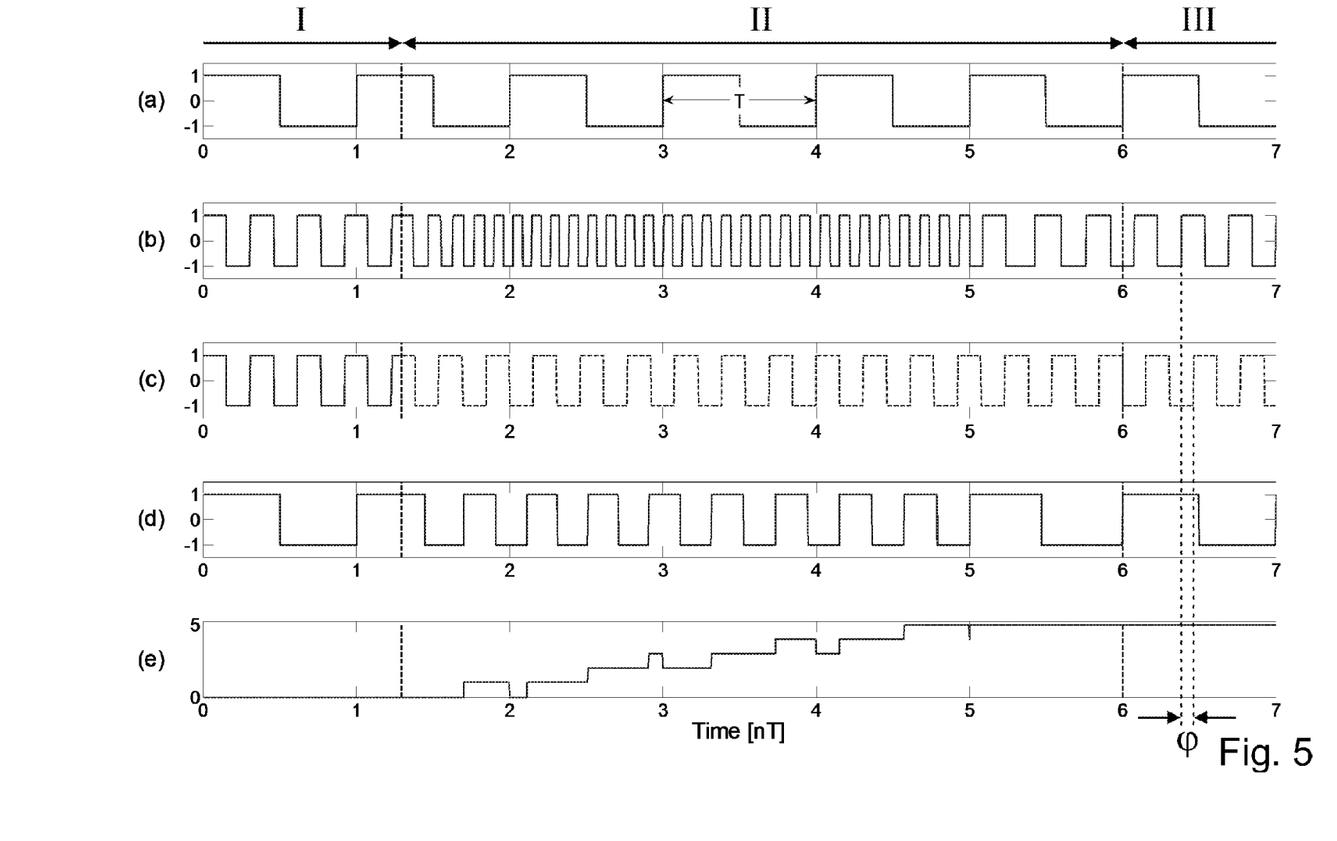
FIG. 5 illustrates the time-dependence of several parameters used in the method according to the invention.

FIG. 5 shows several parameters as functions of time, where time is measured in periods of the reference signal which is shown in (a). It should be noted here that FIG. 5 is only illustrative and does not reflect divide ratios and other parameters as used in the GNSS circuit.

When front-end synthesizer 6 is locked, phase detector 31 controls VCO 33 in such a way that the difference between the phases of the reference signal (a) and the frequency-divided signal (d) is constant, preferably zero. As a consequence, the frequency $f_{fd}$ of the frequency-divided signal (d) equals the frequency $f_r$ of the reference signal (a) and, in view of (1), this leads to $$f_s=Nf \cdot f_r. \quad (2)$$

This situation is shown in a first state-of-lock interval I of FIG. 5.

When lock is lost, e.g., the difference between the phases of reference signal (a) and frequency-divided signal (d) is not kept constant but varies, the synthesizer signal (b) will assume a different—in the example a greater—frequency, as shown in the loss-of-lock interval II of FIG. 5. When lock has been regained, as in the second state-of-lock interval III of FIG. 5, the frequency $f_s$ of the synthesizer signal satisfies again the relation (2), however, the portion of the synthesizer signal in state-of-lock interval I which precedes the loss-of-lock interval II and the portion of the synthesizer signal in state-of-lock interval III which follows the loss-of-lock interval II are, as a rule, not phase coherent. This becomes apparent from a comparison of the synthesizer signal (b) with (c) in FIG. 5 where (c) represents a virtual synthesizer signal which continues through the loss-of-lock interval II undisturbed, i.e., as if no loss of lock had occurred. The factual synthesizer signal (b) differs by a phase offset φ from the virtual synthesizer signal (c).

A correction term is therefore determined which allows compensation of the phase offset by appropriately controlling the NCO 29 as will be explained below. For this purpose up-down counter 36 responds to cycles of the reference signal (a) of FIG. 5 and of the frequency-divided signal (d), e.g., counting up by one when it detects a positive edge of the frequency-divided signal (d) and down by one when it detects a positive edge of the reference signal (a). As long as the front-end synthesizer 6 is locked as in the first state-of-lock interval I, the edges of the reference signal (a) and of the frequency-divided signal (d) virtually coincide. The count of up-down counter 36 shown in (e) therefore remains at zero.

During the loss-of-lock interval II the positive edges of the frequency-divided signal (d) begin to precede the positive edges of the reference signal (a) due to the increased frequency of the synthesizer signal (b). As a result, the up-down counter 36 begins to register the positive edges of the frequency-divided signal (d) and the reference signal (a) and to count up and down accordingly.

When lock has, after a settling time, been fully regained, that is, in the second state-of-lock interval III, the count remains constant as the positive edges of the reference signal (a) and the frequency-divided signal (d) coincide again. The stabilisation of the count can be used as a criterion for the restoration of a state of lock.

The count (e) shows the cycle difference D between the number of cycles $C_{fd}$ of the frequency-divided signal (d) and the number of cycles $C_r$ of the reference signal (a), i.e., $$D=C_{fd}-C_r, \quad (3)$$

as it develops during the loss-of-lock-interval II. The cycle difference is encoded by the cycle count signal.

As the frequency relation (1) is always valid, whether the synthesizer is locked or not, an offset term reflecting the phase offset which has developed between the actual synthesizer signal (b) and the virtual synthesizer signal (c) during loss of lock can now be determined in the offset calculation unit 30 as $$d = Nf \cdot D, \quad (4)$$

i.e., the product of the divide ratio and the cycle difference at the end of loss-of-lock interval II.

The actual phase offset $\phi$ of the synthesizer signal (b) is $2\pi d$. This results in a phase shift of $\delta = \phi/2$ in the local oscillator signals, due to their frequency $f_{LO}$ being half the frequency $f_s$ of the synthesizer signal (b).

As the phase is, due to the periodicity of the local oscillator signals, only defined modulo $2\pi$ the phase shift can be redefined as $$\delta = \text{mod}(\phi/2, 2\pi). \quad (5)$$

A corresponding correction term $-\delta$ is calculated in offset calculation unit 30 and used to control the NCO 29 as explained below. It is, of course, equivalent and often more convenient to work directly with the fractional part of d/2, i.e., $$d' = \text{mod}(d/2, 1) \quad (6)$$

and calculate the phase shift as $$\delta = 2\pi d'. \quad (7)$$

After the calculation of the phase shift the up-down counter 36 can be reset to zero.

In the illustrative example of FIG. 5, the divide ratio Nf equals 3.25, the number of positive edges $C_{fd}$ of the frequency divided signal (d) in the loss-of-lock interval II is 9 and the number $C_r$ of positive edges of the reference signal (a) in the loss-of-lock interval II is 4. The cycle difference D (e) at the end of the loss-of-lock interval II is therefore 5 and the offset term d=Nf·D equals 16.25, resulting in a phase offset $\phi$ of $32.5\pi$ of the synthesizer signal which reduces to $\pi/2$ or 90° due to periodicity and a phase shift $\delta$ of the local oscillator signals of $\pi/4$ or 45°. This result can also be derived more directly, using (6) which yields d'=mod(d/2,1)=0.125 and (7). The correction term is $-\pi/4$, the negative of phase shift $\delta$.

It is, of course, also possible to use an up-down counter which counts down for positive edges of the frequency-divided signal and up for positive edges of the reference signal or an up-down counter responsive to negative edges. But the cycle detector can also be embodied in other ways, e.g., instead of as an up-down counter as a cycle counter comprising two up-counters counting the cycles of the frequency-divided signal (d) and of the reference signal (a), respectively. The cycle count signal then encodes the results of both counts and the cycle difference D can be determined as the difference between the counts at the end of a loss-of-lock interval in the offset calculation unit 30 and the up-counters reset. As a further possibility, the cycle detector can merely register, e.g., positive edges in the frequency-divided signal and in the reference signal and encode them in the cycle signal. The actual counting can then be done in the offset calculation unit.

The component of the signal received at antenna 1 which is of interest here can be represented as $$S(t) = M(t)\cos 2\pi f_c t \quad (8)$$

with $f_c$ representing the carrier frequency and M(t) a modulator encoding data which assumes the values +1 and −1. Frequency conversion by analog mixers 9a,b which mix this signal with the local oscillator signals produced by front-end synthesizer 6, $\cos 2\pi f_{LO} t$ and $\sin 2\pi f_{LO} t$, respectively, results in a complex analog down-converted signal. Filtering by filters 10a;b and 11a;b, amplification by variable gain amplifiers 12a;b and, finally, A/D conversion by A/D-converters 15a;b yields a complex digital IF signal $$S_i(t) = M(t) e^{-2\pi i [(f_c - f_{LO})t]} \quad (9)$$

or $$S_i(t) = M(t) e^{-2\pi i f_i t} \quad (10)$$

with $$f_i = f_c - f_{LO} \quad (11)$$

representing the intermediate frequency, apart from an initial phase shift between the carrier of the received signal S(t) and the local oscillator signals which results in a multiplication of the signal by a complex constant of absolute value 1 and can be disregarded here.

If the IF signal during the first state-of-lock interval I is represented by (10) and, as a result of a loss of lock in front-end synthesizer 6 during loss-of-lock interval II, a phase offset $\phi$ is introduced into the synthesizer signal, the IF signal in state-of-lock interval III is $$S_i'(t) = M(t) e^{-2\pi i f_i t + i\delta} \quad (12)$$

where $\delta = \phi/2$ is the phase shift of the local oscillator signals resulting from the phase offset.

The IF signal is then derotated by mixing with a derotation signal, a complex digital exponential signal $e^{2\pi i f_i t}$, which results, in the first state-of-lock interval I, in a baseband signal portion $$S_b^I(t) = M(t) \quad (13)$$

and in the second state-of-lock interval III in a phase-shifted baseband signal portion $$S_b^{III}(t) = M(t) e^{i\delta}. \quad (14)$$

In order to compensate this phase shift offset calculation unit 30, after having calculated the phase shift $\delta$ from the offset term d following (4), (6) and (7), controls the NCO 29 in such a way that the derotation signal it provides to complex mixer 16 during the second state-of-lock state III is subjected to a phase correction determined by the correction term $-\delta$ in that the IF signal is derotated by mixing with a phase-corrected derotation signal $e^{2\pi i f_i t - i\delta}$ which amounts to a multiplication of the baseband signal portion $S_b^{III}(t)$ by $e^{-i\delta}$. The result is a phase-corrected baseband signal $S_b'(t)$ where the (unchanged) signal in the first state-of-lock interval I $$S_b^{I'}(t) = S_b^I(t) = M(t) \quad (15)$$

and the corrected signal in the second state-of-lock interval III $$S_b^{III'}(t) = e^{-i\delta} S_b^{III}(t) = M(t) \quad (16)$$

are phase coherent.

If there is a sequence of loss-of-lock events separating state-of-lock intervals, the phase correction described above can be employed after every loss-of-lock interval to provide a phase-corrected baseband signal which is phase coherent over all state-of-lock intervals. Using the NCO 29 and the mixer 16 as described is a particularly easy way of compensating phase shifts but it is, of course, possible to implement the phase correction in other ways and at some other point of the signal processing chain.

Figure 4:
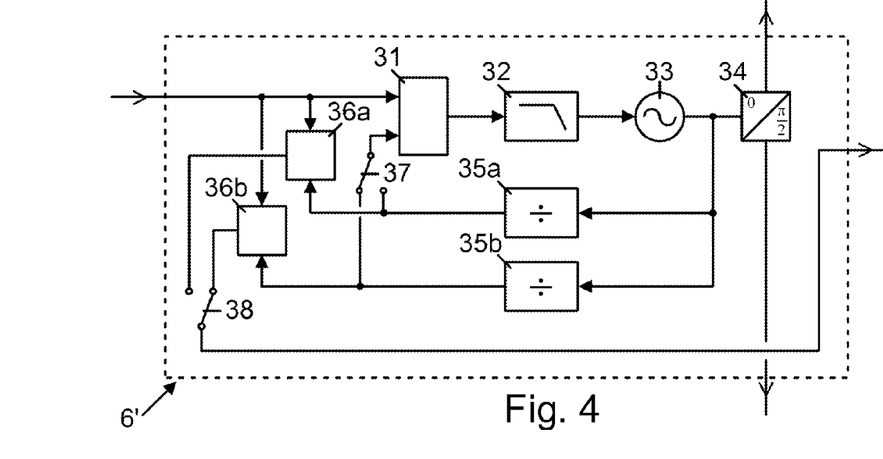
FIG. 4 shows a second embodiment of a fractional-N PLL synthesizer according to the invention.

FIG. 4 shows a second embodiment of a synthesizer according to the invention which can, with small adaptations of the remaining parts of the signal processing device, be used as a front-end synthesizer instead of the synthesizer of FIG. 3 in order to enable the GNSS receiver to alternately use GPS and GLONASS signals. For this purpose, front-end synthesizer 6' has a first feedback path with a first fractional-N frequency divider 35a and a second fractional-N frequency divider 35b. The divide ratio $Nf_b$ of the second frequency divider 35b differs from the divide ratio $Nf_a$ of the first frequency divider 35a. In addition to a first up-down counter 36a which is connected to the output of the first frequency divider 35a and the input of front-end synthesizer 6' a second up-down counter 36b is provided which is connected to the output of the second frequency divider 35b and equally to the input of front-end synthesizer 6'. In this way each feedback path has a corresponding cycle counter.

A feedback switch 37 connects either the output of the first frequency divider 35a or the output of the second frequency divider 35b to the second input of phase detector 31. An output switch 38 connects either the output of the first cycle counter 36a or the output of the second cycle counter 36b to the cycle count output of front-end synthesizer 6' 25 which provides the cycle count signal for the offset calculation unit 30.

If initially the first divide ratio $Nf_a$ is to be used for a first time interval the feedback switch 37 connects the output of the first frequency divider 35a to the second input of phase detector 31 and the output switch 38 connects the first up-down counter 36a to the cycle count output of front-end synthesizer 6'. The first feedback path is locked and the frequency $f_s$ of the synthesizer signal is equal to $Nf_a \cdot f_r$. The second feedback path is in a loss-of-lock state.

If, after the end of the first time interval, the second divide ratio $Nf_b$ is to be used for a second time interval feedback switch 37 connects the output of the second frequency divider 35b with the second input of phase detector 31 and output switch 38 connects the output of the second up-down counter 36b to the cycle count output of front-end synthesizer 6'. The second feedback path is, after a settling time, locked and the first feedback path is in a loss-of-lock state. The cycle difference $D_b$ of the second cycle counter will usually be different from zero and cause a correction term to be calculated and used but this is irrelevant if the second feedback path has not been used before.

However, if the first divide ratio $Nf_a$ is to be used again after the end of the second time interval, the switches are returned to their previous states and the cycle difference $D_a$ of the first cycle counter 36a is provided to offset calculation unit 30 for the calculation of an offset term and a correction term which is then used by NCO 29 for correcting the phase in order to establish phase coherence with the baseband signal of the first time interval.

In this way front-end synthesizer 6' is used alternately with the two different divide ratios $Nf_a$ and $Nf_b$ in that the appropriate feedback path is employed in each case. Only one feedback path can be locked at a time. Its state-of-lock interval is therefore necessarily part of a loss-of-lock interval of the other feedback path. However, as the phase offset formed during any loss-of-lock interval of each feedback path is determined and a compensating correction term is calculated and used for establishing phase coherence on relock, phase coherence over all corresponding state-of-lock intervals is preserved for each of the divide ratios $Nf_a$ and $Nf_b$.

Unless limited otherwise, the terms "connect", "couple", and variations thereof herein are used broadly and encompass direct and indirect connections and couplings.

It is easy to see how this principle can be extended to more than one feedback path, allowing for the alternate use of three or more different divide ratios. Lock cannot be maintained for a given feedback path whenever any of the other feedback paths are locked. However, as the cycle count is carried on by its assigned cycle counter during loss of lock phase coherence can be quickly established whenever the feedback path is again closed and lock has been regained.

LIST OF REFERENCE SYMBOLS 1 antenna
2 radio frequency part
3 band-pass filter
4 TCXO
5 baseband part
6, 6' front-end synthesizer
7 low noise amplifier
8 controllable RF amplifier
9a,b analog mixers
10a,b high-pass filters
11a,b low-pass filters
12a,b variable gain amplifiers
13 baseband synthesizer
14 frequency divider
15a,b A/D converters
16 digital complex mixer
17a,b frequency analyzers
18 control unit
19a,b decimation filters
20a,b down-samplers
21 band-stop unit
22 decimator
23 frequency analyzer
24a,b down-samplers
25 acquisition unit
26 tracking unit
27 frequency divider
28 frequency divider
29 NCO
30 offset calculation unit
31 phase detector
32 loop filter
33 VCO
34 phase shifter
35, 35a,b frequency divider
36, 36a,b cycle counter
37 feedback switch
38 output switch

The invention claimed is:

1. A method of determining an offset term for a synthesizer signal during a second state-of-lock interval following a loss-of-lock interval with respect to the phase of the synthesizer signal during a first state-of-lock interval preceding the loss-of-lock interval, the method comprising:
during the state-of-lock intervals, locking the synthesizer signal to a reference signal via a feedback path in that a phase relation between the reference signal and a frequency-divided signal is held constant, where the frequency-divided signal is derived from the synthesizer signal such that the frequency of the frequency-divided signal equals the frequency of the synthesizer signal divided by a fractional divide ratio, by
assessing a cycle difference between the number of cycles of the reference signal and the number of cycles of the frequency-divided signal of the feedback path during the loss-of-lock interval, and
determining the offset term of the synthesizer signal for the feedback path as a numerical value proportional to the product of the divide ratio and the cycle difference.

2. The method of claim 1, where two or more feedback paths are used alternately, the frequency-divided signal being derived with a specific divide ratio in each case, each feedback path having loss-of-lock intervals comprising any state-of-lock interval of an alternative feedback path, and an offset term is determined for each of the feedback paths after a loss-of-lock interval of the same.

3. A method of producing a phase-corrected digital signal such that the phase-corrected digital signal in a second state-of-lock interval separated from a first state-of-lock interval by a loss-of-lock interval is phase coherent with the phase-corrected digital signal in the first state-of-lock interval, the phase-corrected digital signal being derived from an analog input signal, the method comprising:
  frequency converting the analog input signal by mixing with a local oscillator signal derived from a synthesizer signal which is, during the state-of-lock intervals, locked to a reference signal via a feedback path in that a phase relation between the reference signal and a frequency-divided signal is held constant where the frequency-divided signal is derived from the synthesizer signal such that the frequency of the frequency-divided signal equals the frequency of the synthesizer signal divided by a fractional divide ratio,
  converting the resulting frequency converted analog signal to a digital signal, and
  deriving the phase-corrected digital signal from the digital signal, the deriving the phase-corrected digital signal includes, after the loss-of-lock interval,
    deriving a correction term from an offset term determined in that a cycle difference between the number of cycles of the reference signal and the number of cycles of the frequency-divided signal of the feedback path during the loss-of-lock interval is assessed and the offset term of the synthesizer signal for the feedback path determined as a numerical value proportional to the product of the divide ratio and the cycle difference, and
    correcting the phase of the digital signal in the second state-of-lock interval in accordance with the correction term.

4. The method of claim 3, where the digital signal is a complex digital IF signal, the phase-corrected digital signal is derived from the latter signal by mixing of the same with a complex digital exponential signal, and the correction of the phase is effected in that the complex digital exponential signal is subjected to a phase correction proportional to the correction term.

5. The method of claim 4, where the complex digital exponential signal is a derotation signal such that the phase-corrected digital signal is a phase-corrected baseband signal.

6. The method of claim 3, where two or more feedback paths are used alternately, the frequency-divided signal being derived with a specific divide ratio in each case, each feedback path having loss-of-lock intervals comprising any state-of-lock interval of an alternative feedback path, and an offset term is determined for each of the feedback paths after a loss-of-lock interval of the same.

7. A fractional-N PLL synthesizer, comprising:
  a phase detector with a first input for receiving a periodic reference signal,
  an oscillator, controlled by the phase detector, for producing, at an output, a synthesizer signal,
  a cycle count output,
  a feedback path having a fractional-N frequency divider with an input connected to the output of the oscillator for producing, at an output, a frequency-divided signal whose frequency equals the frequency of the synthesizer signal divided by a fractional divide ratio, the output of the frequency divider being connected or connectable to a second input of the phase detector for closing the feedback path, and
  a cycle detector connected to the first input of the phase detector and with the output of the frequency divider and responsive to cycles of the reference signal and the frequency-divided signal, for providing a cycle count signal at the cycle count output.

8. The synthesizer of claim 7, where the cycle detector is an up-down counter, counting up for detected cycles of the frequency-divided signal and counting down for detected cycles of the reference signal, or vice versa.

9. The synthesizer of claim 7, further comprising a phase shifter for deriving from the synthesizer signal a first local oscillator signal and a second local oscillator signal shifted by $\pi/2$ with respect to the first local oscillator signal.

10. A fractional-N PLL synthesizer, comprising:
  a phase detector with a first input for receiving a periodic reference signal,
  an oscillator, controlled by the phase detector, for producing, at an output, a synthesizer signal,
  a cycle count output,
  two or more feedback paths, each having a fractional-N frequency divider with an input connected to the output of the oscillator for producing, at an output, a frequency-divided signal whose frequency is related to the frequency of the synthesizer signal by a non-integer divide ratio specific to the feedback path,
  a feedback switch where each of the outputs of the frequency dividers can be alternately connected to the second input of the phase detector for closing the respective feedback path,
  for each feedback path, a cycle detector connected to the first input of the phase detector and the output of the frequency divider and responsive to cycles of the reference signal and the frequency-divided signal, for providing a cycle count signal at an output, and
  an output switch where the output of each cycle detector can alternately be connected to the cycle count output.

11. A signal processing device comprising:
  a phase detector with a first input for receiving a periodic reference signal,
  an oscillator, controlled by the phase detector, for producing, at an output, a synthesizer signal,
  a feedback path having a frequency divider with an input connected to the output of the oscillator for producing, at an output, a frequency-divided signal whose frequency equals the frequency of the synthesizer signal divided by a fractional divide ratio, the output of the frequency divider being connected or connectable to a second input of the phase detector for closing the feedback path,
  a cycle detector connected to the first input of the phase detector and with the output of the frequency divider and responsive to cycles of the reference signal and the frequency-divided signal, for producing a cycle count signal,
  a phase shifter for deriving from the synthesizer signal a first local oscillator signal and a second local oscillator signal shifted by $\pi/2$ with respect to the first local oscillator signal,
  a first analog mixer receiving the first local oscillator signal and a second analog mixer receiving the second local oscillator signal for deriving from an analog input signal a complex analog frequency converted signal,
  analog-to-digital converters for deriving from the complex analog frequency converted signal a complex digital IF signal, and a complex mixer controlled by a numerically controlled oscillator configured to provide a complex digital exponential signal which is phase-corrected in accordance with a correction term depending on the cycle count signal, for mixing the complex digital IF signal with the complex digital exponential signal to produce a phase-corrected digital signal.

12. The signal processing device of claim 11, further comprising an offset calculation unit which is connected between the cycle detector and the numerically controlled oscillator and configured to derive the correction term from the product of the divide ratio and a cycle difference derived from the cycle count signal.

13. The signal processing device of claim 11, further comprising an offset calculation unit that is connected between the cycle count output and the numerically controlled oscillator and configured to derive the correction term from the product of the divide ratio and a cycle difference derived from the cycle count signal.

14. A GNSS receiver comprising a signal processing device according to claim 11.

15. A signal processing device comprising:
a phase detector with a first input for receiving a periodic reference signal,
an oscillator, controlled by the phase detector, for producing, at an output, a synthesizer signal,
two or more feedback paths, each having a frequency divider with an input connected to the output of the oscillator for producing, at an output, a frequency-divided signal whose frequency is related to the frequency of the synthesizer signal by a non-integer divide ratio specific to the feedback path,
a feedback switch where each of the outputs of the frequency dividers can be alternately connected to the second input of the phase detector for closing the respective feedback path,
for each feedback path, a cycle detector connected to the first input of the phase detector and the output of the frequency divider and responsive to cycles of the reference signal and the frequency-divided signal,
an output switch where an output of each cycle detector can alternately be connected to a cycle count output providing a cycle count signal,
a phase shifter for deriving from the synthesizer signal a first local oscillator signal and a second local oscillator signal shifted by $\pi/2$ with respect to the first local oscillator signal,
a first analog mixer receiving the first local oscillator signal and a second analog mixer receiving the second local oscillator signal for deriving from an analog input signal a complex analog frequency converted signal,
analog-to-digital converters for deriving from the complex analog frequency converted signal a complex digital IF signal, and
a complex mixer controlled by a numerically controlled oscillator which is configured to provide a complex digital exponential signal that is phase-corrected in accordance with a correction term depending on the cycle count signal, for mixing the complex digital IF signal with the complex digital exponential signal to produce a phase-corrected digital signal.

16. A GNSS receiver comprising a signal processing device according to claim 15.

* * * * *